(12) United States Patent
Kiyohara (10) Patent No.: US 6,894,370 B2
(45) Date of Patent: May 17, 2005

(54) LEAD FRAME AND SEMICONDUCTOR DEVICE HAVING THE SAME AS WELL AS METHOD OF RESIN-MOLDING THE SAME

(75) Inventor: Toshinori Kiyohara, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 0 days.

(21) Appl. No.: 10/207,055

(22) Filed: Jul. 30, 2002

(65) Prior Publication Data

US 2003/0020148 A1 Jan. 30, 2003

(30) Foreign Application Priority Data

Jul. 30, 2001 (JP) ......................................... 2001-230112

(51) Int. Cl.[7] ............................................. H01L 23/495
(52) U.S. Cl. ....................... 257/666; 257/667; 257/669; 257/670; 257/673; 257/676; 257/724
(58) Field of Search ................................ 257/666, 667, 257/668, 669, 670, 671, 672, 673, 674, 675, 676, 692, 693, 694, 695, 696, 724; 438/123, 124

(56) References Cited

U.S. PATENT DOCUMENTS

| | | | | |
|---|---|---|---|---|
| 4,791,472 A | * | 12/1988 | Okikawa et al. ............ | 257/669 |
| 5,250,839 A | * | 10/1993 | Katoh et al. ................ | 257/666 |
| 5,394,751 A | * | 3/1995 | Ishibashi .................... | 257/676 |
| 5,517,056 A | * | 5/1996 | Bigler et al. ................ | 257/670 |
| 5,554,885 A | * | 9/1996 | Yamasaki et al. .......... | 257/669 |
| 5,708,293 A | * | 1/1998 | Ochi et al. .................. | 257/666 |
| 5,874,773 A | * | 2/1999 | Terada et al. ............... | 257/676 |
| 6,020,625 A | * | 2/2000 | Qin et al. .................... | 257/666 |
| 6,075,283 A | | 6/2000 | Kinsman et al. | |
| 6,339,252 B1 | * | 1/2002 | Niones et al. .............. | 257/666 |

FOREIGN PATENT DOCUMENTS

| | | |
|---|---|---|
| JP | 5-267539 A | 10/1993 |
| JP | 5-315499 A | 11/1993 |

* cited by examiner

*Primary Examiner*—Eddie Lee
*Assistant Examiner*—Quang Vu
(74) *Attorney, Agent, or Firm*—Sughrue Mion, PLLC (57) ABSTRACT

A lead frame structure includes: at least a die pad for mounting a semiconductor chip thereon; a plurality of suspension members mechanically connected with the die pad; and a plurality of supporting members. Each supporting member has a connection region mechanically connected with each of the plurality of suspension members for mechanically supporting the at least die pad via the plurality of suspension pins. The connection region of the supporting member has a penetrating opening portion which provides a mechanical flexibility to the connection region and which allows the connection region to be deformed toward the suspension member upon application of a tensile stress to the suspension member in a down-set process.

4 Claims, 11 Drawing Sheets

LEAD FRAME AND SEMICONDUCTOR DEVICE HAVING THE SAME AS WELL AS METHOD OF RESIN-MOLDING THE SAME

BACKGROUND OF THE INVENTION

1. Field of the Invention

The present invention relates to a lead frame and a semiconductor device having the same as well as a method of resin-molding the same.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

In recent years, the importance of the high density packaging technique for realizing an ultra-high density integration of the semiconductor device has been on the increase. In case that the semiconductor chip has a single transistor such as a power transistor, it is important to mounting a heat radiator onto the semiconductor device, even a possible reduction of the cost of the semiconductor device is strongly required. In order to satisfy both requirements for the heat radiation and the cost reduction, a "down-set" was proposed, wherein each die pad of the lead frame is depressed down or set down, so that the die pad has a lower level than the other part of the lead frame, and the semiconductor chip is thus mounted on this down-set die pad. The semiconductor device mounted on the down-set die pad is then resin-molded, wherein a bottom surface of the down-set die pad is exposed or shown from the bottom of the molding resin, so that the down set-die pad serves as a heat radiator or a heat radiation channel.

The down-set process for the die pad causes a variety of mechanical stress to the die pad, suspension pins and frame portions. In case, this mechanical stress may cause a disconnection of one or more suspension pins and/or any undesirable deformation of the frame portions.

Figure 1:
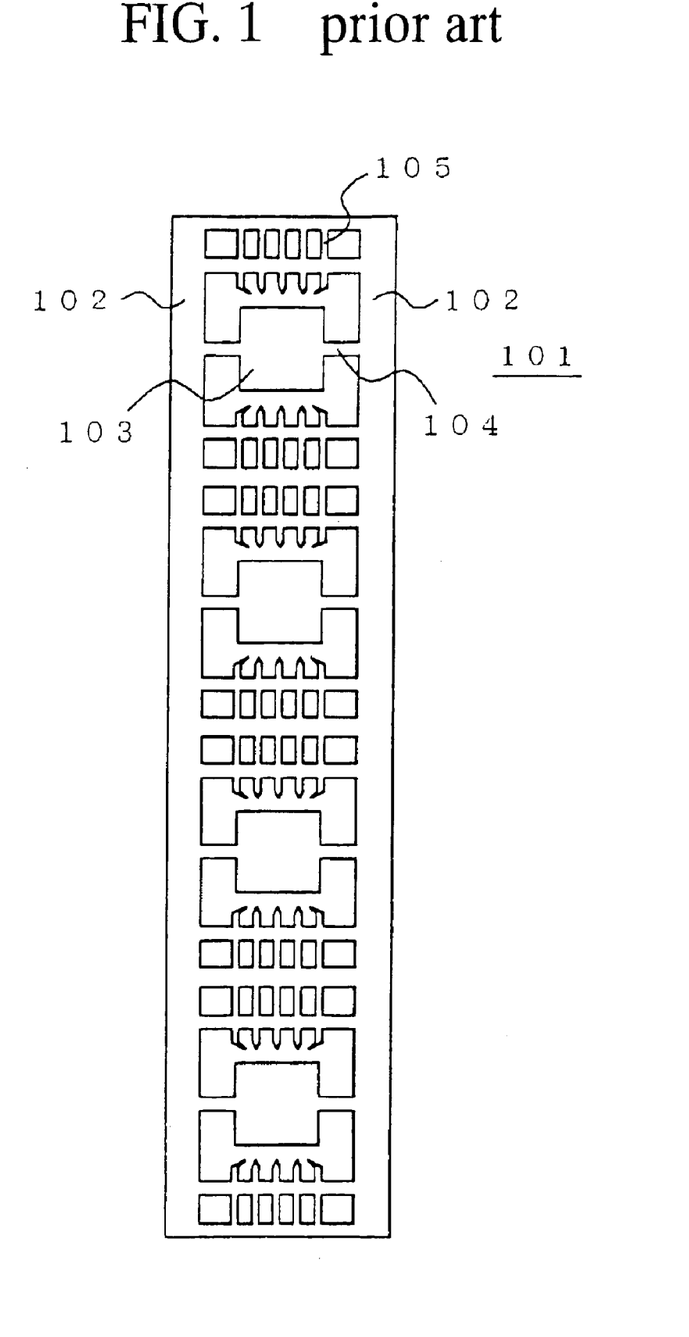
FIG. 1 is a fragmentary plan view of a conventional-lead frame structure designed for avoiding any undesired deformation due to the down-set process.

Japanese laid-open patent publication No. 5-315499 discloses a conventional lead frame structure designed for avoiding any undesired deformation due to the down-set process. FIG. 1 is a schematic fragmentary plan view of a conventional lead frame structure designed for avoiding any undesired deformation due to the down-set process disclosed in Japanese laid-open patent publication No. 5-315499. A lead frame 101 has double frames 102 extending in parallel to each other. A plurality of die pad 103 is aligned between the double frames 102 and in a direction parallel to the extension direction of the double frames 102. Each die pad 103 is mechanically connected through a pair of suspension pins 104 to the frames 102. Namely, the suspension pins 104 are thus positioned inside of the frames 102 and opposite outsides of the die pad 103 so as to provide a mechanical connection between the each die pad 104 and the frames 102. The each die pad 103 is also surrounded by a set of plural leads 105 which provide electrical connections through bonding wires to a semiconductor chip not shown which is mounted on the die pad 103.

The each semiconductor chip is mounted on the each die pad 103, where the die pad 103 is depressed by a die, whereby the level of the die pad 103 becomes lower than the frames 102. This process for level-down of the die pad 103 is so called to as "down-set". This down-set of the die pad 103 causes a certain increase in a distance in three-dimensional space between the die pad 103 and the frames 102. This amount of increase of the distance depends on the amount of the level down.

Figure 2:
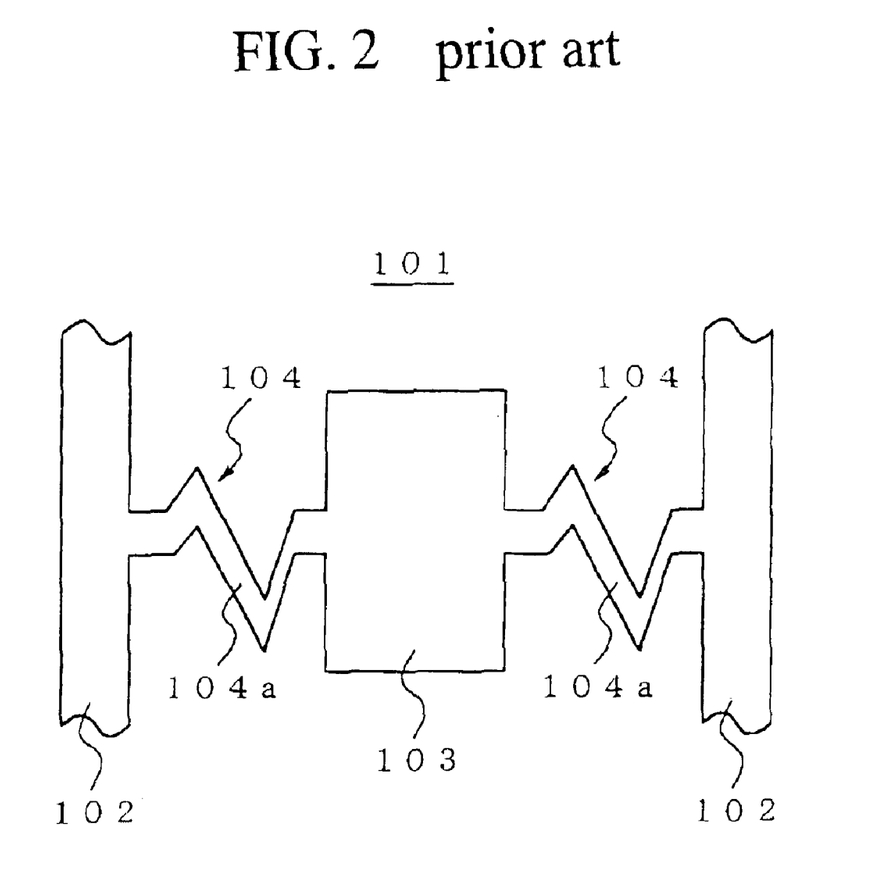
FIG. 2 is a fragmentary plan view of a pair of the modified suspension pins for providing a mechanical connection with a flexibility in distance between the die pad and the frames included in the lead frame of FIG. 1.

In accordance with this conventional technique, the suspension pins 104 are modified for responding to variation in the distance between the die pad 103 and the frames 102 upon the down-set process. FIG. 2 is a fragmentary plan view of a pair of the modified suspension pins for providing a mechanical connection with a flexibility in distance between the die pad and the frames included in the lead frame of FIG. 1. Each of the paired suspension pins 104 has a zigzag shaped portion 104a in plan view. This zigzag shaped portion provides a certain mechanical flexibility which allows a limited variation in the distance between the die pad 103 and the frames 102 upon the down-set process. This mechanical flexibility absorbs or relax a certain mechanical stress applied to the suspension pins 104 due to variation in the distance between the die pad 103 and the frames 102 upon the down-set process. This mechanical flexibility also makes it easy to accomplish the down-set process. For those reasons, the zigzag shaped portion may also serve as a mechanical stress absorption portion.

Figure 3:
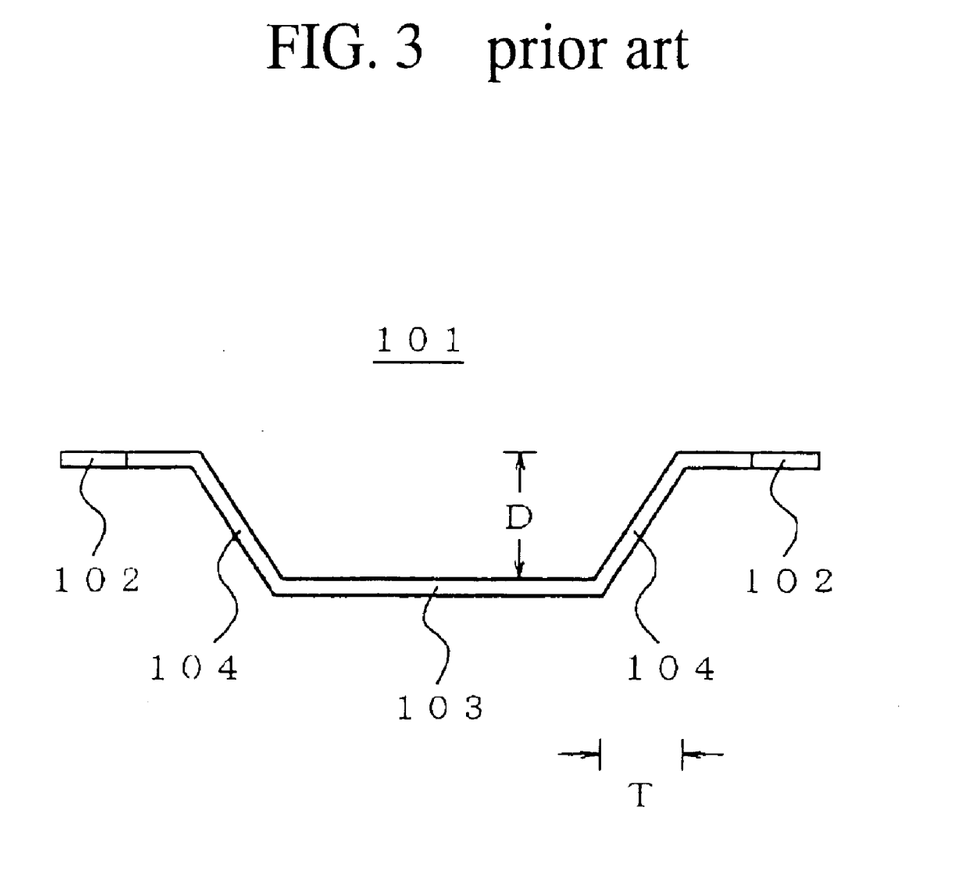
FIG. 3 is a cross sectional elevation view of the down-set die pad connected through the modified suspension pins to the frames in FIG. 1.

FIG. 3 is a cross sectional elevation view of the down-set die pad connected through the modified suspension pins to the frames in FIG. 1. In the down-set process, the die pad 103 is depressed by the press of the die and becomes level-down by a depth "D" from the flames 102, while having a horizontal distance "T" remain unchanged, wherein the zigzag shaped portions 104a of the suspension pins 104 are elastically deformed to show a stretch or an extension by an increase in the distance between the die pad 103 and the flames 102. After the die is released or removed from the state of pressing the die pad 103, the zigzag shaped portions 104a still remain stretched to provide substantially no mechanical stress to the flames 102. Namely, the zigzag shaped portions 104a make the flames 102 free from any undesired deformation in connection of the down-set process. The zigzag shaped portions 104a also make the suspension pins 104 free from a possible disconnection involved in the down-set process.

Consequently, the zigzag shaped portions 104a provide such both a desired mechanical flexibility and a mechanical stress absorption as to allow the down set process to make the die pad 103 become level-down from the flames 102 by the depth "D", while having the horizontal distance "T" remain unchanged, without causing any undesired deformation of the flames 102 and any disconnection of the suspension pins 104. As shown in FIG. 3, the horizontal distance "T" is defined in a horizontal direction perpendicular to the longitudinal direction, along which the double frames 102 extend.

Japanese laid-open patent publication No. 5-267539 also discloses another conventional lead frame structure designed for avoiding any undesired deformation due to the down-set process. The disclosed technical concept in connection with the counter-measure to the down-set process is substantially equivalent to the above-described conventional technique. A lead frame has a modified support bar which acts as a suspension pin for supporting a stage which acts as a die pad. The modified support bar has a stretchable s stress absorber portion which may exhibit substantially similar function as the above-described zigzag shaped portions, but which are structurally different from them. The stretchable s stress absorber portion comprises an annular portion connected to the support bar and a cross sectional portion.

Returning back to the issue of heat radiation, a heat radiation technique is important for mounting a power transistor such as MOSFET, MESFET or bipolar transistor, particularly for a vertical type MOSFET with a larger current in operation.

In parallel to the above requirement for improvement in the heat radiation structure, a possible shrinking technique of the semiconductor device or a possible increase in the packaging density of the power transistors with the lead frame are also important in view of a possible cost reduction and a possible size-down of an electron device, on which the semiconductor devices are mounted.

The present inventor confirmed the following facts. A highly stretchable material for the suspension pin is effective to avoid a possible disconnection of the suspension pin in the down-set process, but which is insufficient in hardness for the lead frame. Namely, the realization of the practically using lead frame needs sufficient hardness not only to the frames but also the suspension pins. If the suspension pin has an increased hardness, then this may cause another problem with undesirable limitation to the necessary stretchability and may allow a frequency of disconnection of the suspension pins. For those reasons, simple dependence upon selection of any stretchable material for the suspension pins are still engaged with any problems described above.

Further, as shown in FIGS. 2 and 3, the above-described conventional modified suspension pin 104 has the zigzag-shaped stretchable portion 104a which gives rise to a certain increase in the length size of the suspension pin 104. The horizontal size "T" should be sufficiently large with reference to the depth "D". Ensuring the sufficiently large horizontal size "T" of the suspension pin 104 makes it difficult to realize a desired increase in the packaging density.

As shown in FIG. 2, the size of the die pad is defined by subtraction of a double of the horizontal size of the suspension pin 104 from the horizontal distance between the paired frames 102. Increase in the horizontal size "T" of the suspension pin 104, while fixing the horizontal distance between the paired frames 102 would give rise to a certain decrease in the size of the die pad which provides a possible occupied area for the semiconductor device to be mounted on the die pad 103. The decrease in the size of the die pad results in a decrease in the packaging density of the semiconductor device. The decrease in the packaging density make it difficult to realize a desired shrinkage of the semiconductor device. Further the increase in the size of the lead frame makes it difficult to achieve an appreciable cost reduction.

A further important issue for manufacturing the semiconductor device is how to improve the return on investment. It will be preferable as an example for improving the return on investment that the same dies are commonly used for semiconductor packages of different types, for example, down-set free package, down-set packages with various depths in down set. In accordance with the above-described prior art, however, the necessary minimum length of the suspension pin would depend on the down-set, and also the depth of the down-set. For this reason, the prior art does not allow the desired common use of the same dies for a down-set variety of the semiconductor packages the prior art is unsuitable for improving the return on investment.

In the above circumstances, the development of a novel lead frame structure free from the above problems is desirable.

SUMMARY OF THE INVENTION

Accordingly, it is an object of the present invention to provide a novel lead frame structure free from the above problems.

It is a further object of the present invention to provide a novel lead frame structure suitable for down-set with realizing a desired high packaging density.

It is a still further object of the present invention to provide a novel lead frame structure suitable for down-set with allowing a desired high shrinkage of the semiconductor device.

It is yet a further object of the present invention to provide a novel lead frame structure suitable for down-set free from any undesired cost increase.

It is yet a further object of the present invention to provide a novel lead frame structure suitable for down-set free from any undesired appearance of disconnection of suspension pin and application of mechanical stress to frame portions.

It is further more object of the present invention to provide a novel lead frame structure suitable for down-set and also heat radiation.

It is moreover object of the present invention to provide a novel lead frame structure suitable for down-set and also return on the investment.

It is another object of the present invention to provide a novel semiconductor device having an improved lead frame structure free from the above problems.

It is further another object of the present invention to provide a novel semiconductor device having an improved lead frame structure suitable for down-set with realizing a desired high packaging density.

It is still further another object of the present invention to provide a novel semiconductor device having an improved lead frame structure suitable for down-set with allowing a desired high shrinkage of the semiconductor device.

It is yet further another object of the present invention to provide a novel semiconductor device having an improved lead frame structure suitable for down-set free from any undesired cost increase.

It is still more object of the present invention to provide a novel semiconductor device having an improved lead frame structure suitable for down-set free from any undesired appearance of disconnection of suspension pin and application of mechanical stress to frame portions.

It is further more object of the present invention to provide a novel semiconductor device having an improved lead frame structure suitable for down-set and also heat radiation.

It is moreover object of the present invention to provide a novel semiconductor device having an improved lead frame structure suitable for down-set and also return on the investment.

It is an additional object of the present invention to provide a novel method of packaging a semiconductor device having an improved lead frame structure free from the above problems.

It is a further additional object of the present invention to provide a novel method of packaging a semiconductor device having an improved lead frame structure suitable for down-set with realizing a desired high packaging density.

It is a still further additional object of the present invention to provide a novel method of packaging a semiconductor device having an improved lead frame structure suitable for down-set with allowing a desired high shrinkage of the semiconductor device.

It is yet a further additional object of the present invention to provide a novel method of packaging a semiconductor device having an improved lead frame structure suitable for down-set free from any undesired cost increase.

It is still more additional object of the present invention to provide a novel method of packaging a semiconductor device having an improved lead frame structure suitable for down-set free from any undesired appearance of disconnection of suspension pin and application of mechanical stress to frame portions.

It is further more additional object of the present invention to provide a novel method of packaging a semiconductor device having an improved lead frame structure suitable for down-set and also heat radiation.

It is moreover additional object of the present invention to provide a novel method of packaging a semiconductor device having an improved lead frame structure suitable for down-set and also return on the investment.

The present invention provides a lead frame structure including: at least a die pad for mounting a semiconductor chip thereon; a plurality of suspension members mechanically connected with the die pad; a plurality of supporting members, each having a connection region mechanically connected with each of the plurality of suspension members for mechanically supporting the at least die pad via the plurality of suspension pins, wherein the connection region of the supporting member has a penetrating opening portion which provides a mechanical flexibility to the connection region and which allows the connection region to be deformed toward the suspension member upon application of a tensile stress to the suspension member.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

A first aspect of the present invention is a lead frame structure including: at least a die pad for mounting a semiconductor chip thereon; a plurality of suspension members mechanically connected with the die pad; a plurality of supporting members, each having a connection region mechanically connected with each of the plurality of suspension members for mechanically supporting the at least die pad via the plurality of suspension pins, wherein the connection region of the supporting member has a penetrating opening portion which provides a mechanical flexibility to the connection region and which allows the connection region to be deformed toward the suspension member upon application of a tensile stress to the suspension member.

It is preferable one typical example that the penetrating opening portion comprises a single slender-shaped continuously extending opening portion which extends along a longitudinal center axis of the supporting member.

It is further preferable one typical example that the single slender-shaped continuously extending opening portion comprises a slit having opposite closed ends.

It is also preferable as one typical example that the single slender-shaped continuously extending opening portion comprises an open-type notch having an open end and an opposite closed end. Further, the opposite closed end may advantageously have a generally circle-shape.

It is also preferable as one typical example that the penetrating opening portion comprises a single circle-shaped opening portion.

It is also preferable as one typical example that the penetrating opening portion comprises a single oval-shaped opening portion.

It is also preferable as one typical example that the connection region has at least an tapered side-edge which retracts from the suspension member as a position becomes closer to the suspension member.

A second aspect of the present invention is a lead frame structure as down-set including: at least a die pad with a semiconductor chip mounted thereon; a plurality of suspension members mechanically connected with the die pad; a plurality of supporting members, each having a connection region mechanically connected with each of the plurality of suspension members for mechanically supporting the at least die pad via the plurality of suspension members, and the plurality of supporting members having a higher level than the at least die pad, wherein the connection region of the supporting member has a deformed penetrating opening portion toward the suspension member as applied with a tensile stress to the suspension pin in a state of the lead frame as down-set.

It is preferable as one typical example that the penetrating opening portion comprises a single slender-shaped continuously extending opening portion which extends along a longitudinal center axis of the supporting member.

It is also preferable as one typical example that the single slender-shaped continuously extending opening portion comprises a slit having opposite closed ends.

It is also preferable as one typical example that the single slender-shaped continuously extending opening portion comprises an open-type notch having an open end and an opposite closed end.

It is also preferable as one typical example that the opposite closed end has a generally circle-shape.

It is also preferable as one typical example that the penetrating opening portion comprises a single circle-shaped opening portion.

It is also preferable as one typical example that the penetrating opening portion comprises a single oval-shaped opening portion.

It is also preferable as one typical example that the connection region has at least a straight side-edge deformed from such a tapered side-edge as having retracted from the suspension member as a position becomes closer to the suspension member.

A third aspect of the present invention is a semiconductor package including: a die pad: a semiconductor chip mounted on the die pad; a plurality of suspension members mechanically connected with the die pad, and the plurality of suspension members extend outwardly and upwardly from the die pad; and a molding resin embedding the plurality of suspension members and the semiconductor chip, while a bottom surface of the die pad is shown from the molding resin.

A fourth aspect of the present invention is a method of resin-molding a semiconductor chip. The method comprises the following steps. A lead frame is prepared and placed which includes: at least a die pad for mounting a semiconductor chip thereon; a plurality of suspension members mechanically connected with the die pad; and a plurality of supporting members. Each supporting member has a connection region mechanically connected with each of the plurality of suspension members for mechanically supporting the at least die pad via the plurality of suspension pins. The connection region of the supporting member further has a penetrating opening portion. At least a semiconductor chip is then mounted on the at least die pad. The lead frame with the semiconductor chip is then down-set on an inner wall of a bottom resin-molding die, wherein a bottom surface of the die pad is made into contact with the inner wall of the bottom resin-molding die. The penetrating opening portion provides a mechanical flexibility to the connection region and allows the connection region to be deformed toward the suspension member upon application of a tensile stress to the suspension member. A resin injection process is then carried out for resin-molding the semiconductor chip on the die pad to form a resin-molded semiconductor package. Finally, the resin-molded semiconductor package is released from the lead frame.

It is preferable as one typical example that the penetrating opening portion comprises a single slender-shaped continuously extending opening portion which extends along a longitudinal center axis of the supporting member. Further, the single slender-shaped continuously extending opening portion may advantageously comprise a slit having opposite closed ends.

It is also preferable as one typical example that the single slender-shaped continuously extending opening portion comprises an open-type notch having an open end and an opposite closed end. Further, the opposite closed end may advantageously have a generally circle-shape.

It is also preferable as one typical example that the penetrating opening portion comprises a single circle-shaped opening portion.

It is also preferable as one typical example that the penetrating opening portion comprises a single oval-shaped opening portion.

It is also preferable as one typical example that the connection region has a tapered side-edge retracting from the suspension member as a position becomes closer to the suspension member prior to the down-set process.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 4A:
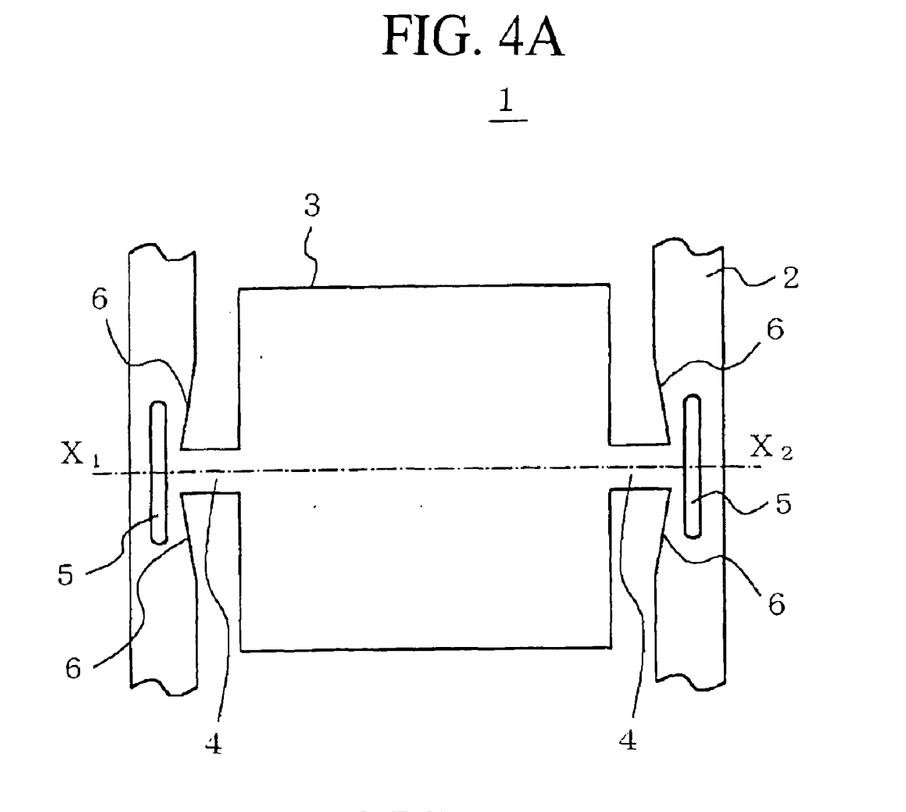
FIG. 4A is a schematic fragmentary plan view of a first typical structure before down-set of a lead frame in a first embodiment according to the present invention.
Figure 4B:
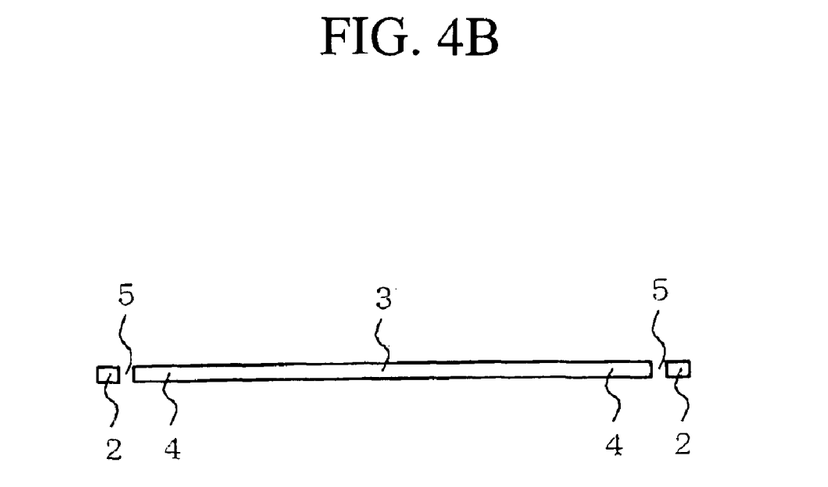
FIG. 4B is a cross sectional elevation view, taken along an X1–X2 line of FIG. 4A.
Figure 4C:
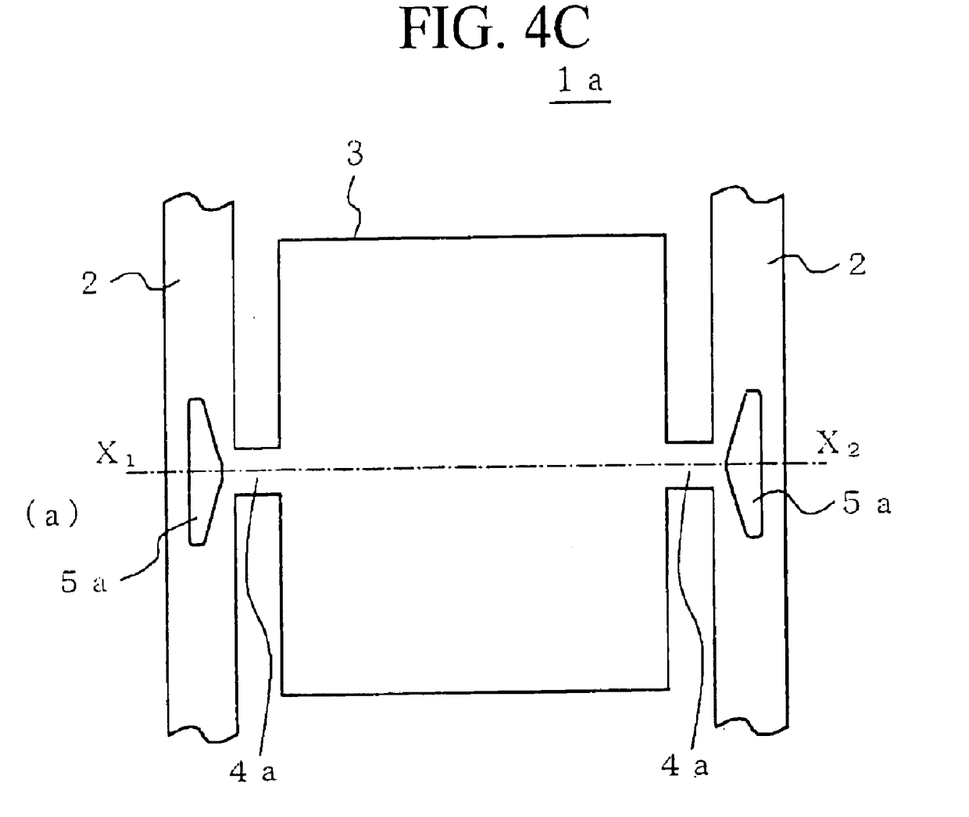
FIG. 4C is a schematic fragmentary plan view of the first typical structure after down-set of the lead frame of FIG. 4A.
Figure 4D:
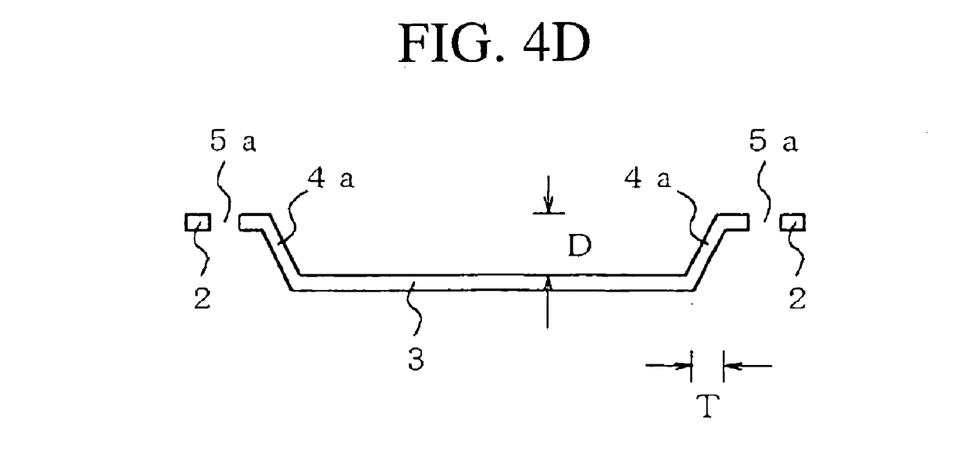
FIG. 4D is a cross sectional elevation view, taken along the X1–X2 line of FIG. 4C.

First Embodiment:

A first embodiment according to the present invention will be described in detail with reference to the drawings. FIG. 4A is a schematic fragmentary plan view of a first typical structure before down-set of a lead frame in a first embodiment according to the present invention. FIG. 4B is a cross sectional elevation view, taken along an X1–X2 line of FIG. 4A. FIG. 4C is a schematic fragmentary plan view of the first typical structure after down-set of the lead frame of FIG. 4A. FIG. 4D is a cross sectional elevation view, taken along the X1–X2 line of FIG. 4C.

A lead frame 1 has a pair of tie bars 2 which extend in parallel to each other in a first horizontal direction. A die pad 3 is mechanically connected through a pair of suspension pins 4 to the paired tie bars 2. The lead frame 1 may optionally and advantageously be made of a metal or an alloy, preferably copper alloys, or iron-nickel alloy. One typical example of the thickness of the lead frame 1 may be, but not limited to, approximately 0.15 mm.

Further, the selected region of the each tie bar 2 in the vicinity of the suspension pin 4 has a slit 5 which has a slender shape with a longitudinal direction parallel to the extension direction of the tie bar 2 and also perpendicular to a center line of the suspension pin 4. The slit 5 may, for example, comprise a single slender-shaped continuously extending opening portion. One typical example of the width of the slit 5 may be identical or approximately similar to the thickness of the lead frame 1, for example, may be, but not limited to the range of 0.15 mm through 0.2 mm. One typical example of the longitudinal length of the slit 5 may be identical or approximately similar to about 10 times of it's width, for example, may be, but not limited to the range of 1.5 mm through 2.0 mm. The longitudinal length of the slit 5 may typically be greater than the length of the suspension pin 4.

The each tie bar 2 has a tapered region 6 which is adjacent to a connection portion to the suspension pin 4, so that a width of the each tie bar 2 proportionally decreases toward the center axis of the suspension pin 4. The tapered region 6 includes the above-described selected region having the slit 5.

In accordance with this first typical embodiment of the present invention, the above-described slit 5 and the tapered region 6 are important for the down-set process to be described below. This lead frame 1 may be formed by press working and may be flat-shape as shown in FIG. 4B.

This flat-shape lead frame 1 as shown in FIGS. 4A and 4B is then subjected to the down-set process using the known dies. The down-set process may be carried out as follows. The tie bars 2 shown in FIGS. 4A and 4B are fixed by stopper. The die pad 3 is sandwiched by a punch and a die to apply a tensile stress to the suspension pins 4. This tensile stress causes the tapered region 6 with the slit 5 to show such respective deformations as shown in FIGS. 4C and 4D. The presence of the slit 5 or the deformations of the tapered region 6 with the slit 5 allow the die pad 3 to show level down from the tie bars 2 by a depth "D" even the suspension pins 4 show a slight stretch. Namely, the deformed slit 5a has a larger width as shown in FIGS. 4C and 4D as compared to the original shape of the slit 5 shown in FIGS. 4A and 4B. The combination of the above-described tapered shape end region 6 toward the center and the slit 5 provides a desired flexibility without application of an excess mechanical tensile stress to the suspension pins 4, whereby the down-set of the die pad 3 can be realized without any possibility of the disconnection of the suspension pins 4.

Further, as shown in FIG. 4C, the deformation of the slit 5 causes the tapered region 6 to have a straight and not-tapered inside edge which is important for the resin-molding process to be described below. The deformation of the tapered region 6 into the straight and not-tapered inside edges allows a highly accurate resin molding, and ensures that the tie bars 2 are free from the undesired resin molding, thereby making it easy to cut the suspension pins 4 to release the semiconductor package from the lead frame 1, wherein the semiconductor chip is mounted on the die pad 3 and resin-molded, while the bottom surface of the die pad 3 is shown from the molding resin.

As shown in FIG. 4D, the combination of the above-described tapered shape end region 6 toward the center and the slit 5 also allows taking a large ratio of the down-set depth "D" with reference to the horizontal size "T" of the suspension pin 4 in the down-set state. This means that the combination of the above-described tapered shape end region 6 toward the center and the slit 5 allows taking a large ratio of the down-set depth "D" with reference to the length size of the suspension pin 4. The horizontal size "T" may, for example, be in the range of "1t" to "2t", wherein "t" is the thickness of the lead frame 1, while the down-set depth "D" may, for example, be "4t" or larger.

For example, if the thickness of the lead frame is 0.15 mm, then the combination of the above-described tapered shape end region 6 toward the center and the slit 5 allows that the down-set depth "D" is set at approximately 0.7 mm, while the horizontal size "T" is set at approximately 0.20 mm.

In contrast to the present invention, the above-described prior art needs a larger horizontal size "T" of not less than approximately 1.0 mm for the same down-set depth "D" of approximately 0.7 mm and the same thickness of 0.15 mm, otherwise resulting in a possible disconnection of the suspension pin.

Accordingly, the combination of the above-described tapered shape end region 6 toward the center and the slit 5 allows taking a large ratio of the down-set depth "D" to the horizontal size "T", thereby making it possible to decrease or reduce the necessary minimum length size of the suspension pin 4. This makes it possible to increase the occupied area of the die pad 3 in the lead frame 1. This would give rise to increase the occupied area of the semiconductor chip as packaged, and thus increase the packaging density of the semiconductor device. The increase of the occupied area of the die pad 3 increases the die pad exposed surface area which defines the heat radiation area, to improve the efficiency of the heat radiation from the semiconductor chip through the die pad 3. The increase in the packaging density causes the size down or the shrinkage of the semiconductor package. This also makes it easy to reduce the manufacturing cost of the semiconductor package.

In this embodiment, the slit 5 may be replaceable by any other penetrating opening with a variety of its shape in plan view, such as a circle or an oval, provided that the penetrating opening should be formed in the tapered region 6 in the vicinity of the connection point to the suspension pin 4. For this reason, the above-described slit 5 should be interpreted to be one or more penetrating opening which is formed in the tapered region 6 in the vicinity of the connection point to the suspension pin 4, wherein the one or more penetrating opening may allow deformations thereof and the tapered shape region, so as to cause the tapered shape region to have a straight and not-tapered inside edge.

Figure 5A:
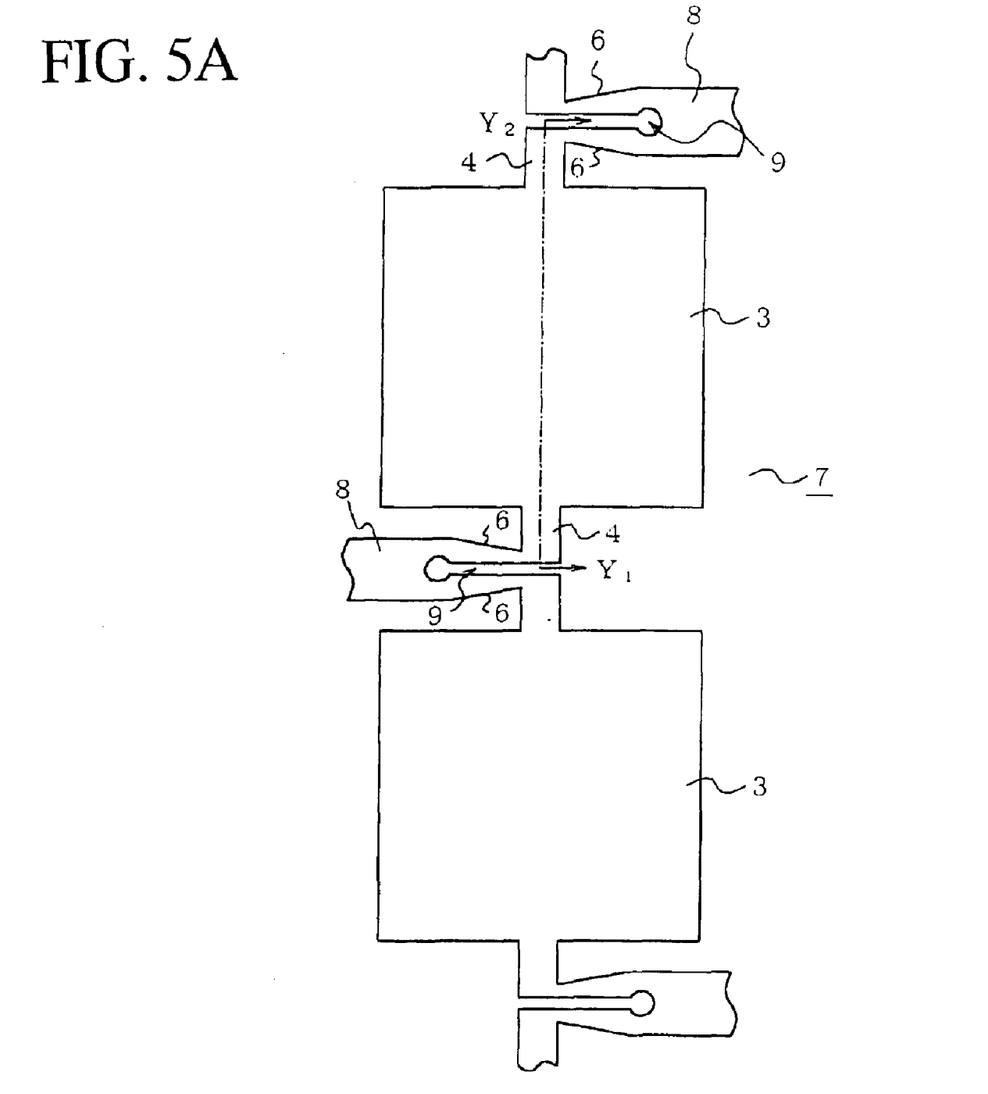
FIG. 5A is a schematic fragmentary plan view of a second typical structure before down-set of a lead frame in a second embodiment according to the present invention.
Figure 5B:
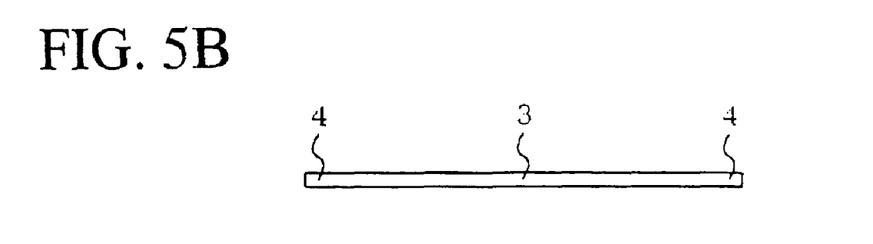
FIG. 5B is a cross sectional elevation view, taken along a Y1–Y2 line of FIG. 5A.
Figure 5C:
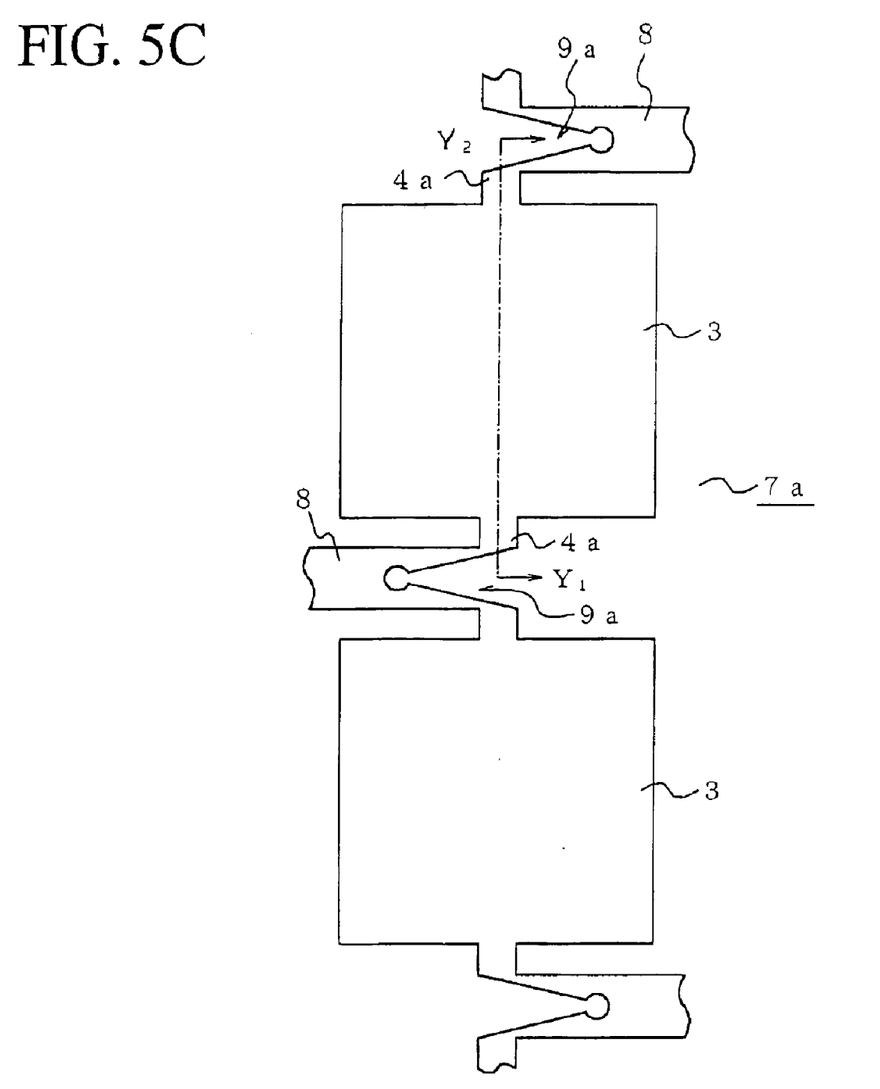
FIG. 5C is a schematic fragmentary plan view of the second typical structure after down-set of the lead frame of FIG. 5A.
Figure 5D:
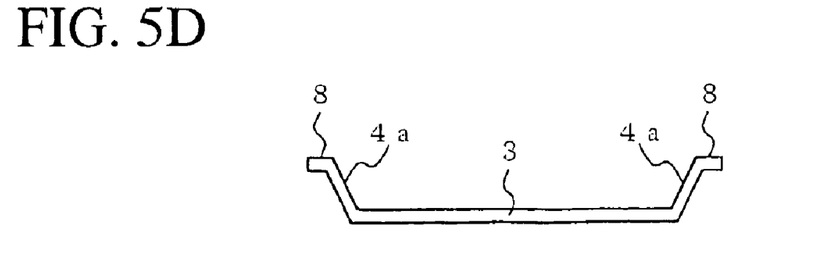
FIG. 5D is a cross sectional elevation view, taken along the Y1–Y2 line of FIG. 5C.

Second Embodiment:

A second embodiment according to the present invention will be described in detail with reference to the drawings. FIG. 5A is a schematic fragmentary plan view of a second typical structure before down-set of a lead frame in a second embodiment according to the present invention. FIG. 5B is a cross sectional elevation view, taken along a Y1–Y2 line of FIG. 5A. FIG. 5C is a schematic fragmentary plan view of the second typical structure after down-set of the lead frame of FIG. 5A. FIG. 5D is a cross sectional elevation view, taken along the Y1–Y2 line of FIG. 5C.

A lead frame 7 has a plurality of die pads 3, which of which is mechanically connected through a pair of suspension pins 4 to adjacent two of plural connection bars 8, so that the each die pad 3 is mechanically supported via the paired suspension pins 4 by the adjacent two of plural connection bars 8. The plural die pads 3 are aligned in a first horizontal direction. The each connection bar 8 has a tapered end region 6 which is connected via adjacent two of the suspension pins 4 to adjacent two of the aligned die pads 3. The each connection bar 8 extends in a second horizontal direction perpendicular to the first horizontal direction, while the adjacent two of the suspension pins 4 extend from the tapered end region 6 in the first horizontal direction to the adjacent two of the die pads 3. Adjacent two of the connection bars 8 extend in anti-parallel directions to each other but parallel to the second horizontal direction.

The tapered end region 6 also has an open-type notch 9 which has a slender shape and extends from the end of the tapered end region 6 in the second horizontal direction along a longitudinal center axis of the each connection bar 8. The open-type notch 9 has an open end and an opposite closed end. The open-type notch 9 divides the tapered end region 6 into two divided tapered parts 6 which are respectively connected via the adjacent two suspension pins 4 to the adjacent two die pads 3.

In accordance with this second typical embodiment of the present invention, the above-described open-type notch 9 and the tapered region 6 are important for the down-set process to be described below. This lead frame 7 may be formed by press working and may be flat-shape as shown in FIG. 5B. The lead frame 7 may optionally and advantageously be made of a metal or an alloy, preferably copper alloys, or iron-nickel alloy.

This flat-shape lead frame 7 as shown in FIGS. 5A and 5B is then subjected to the down-set process using the known dies. The down-set process may be carried out as follows. The connection bars 8 shown in FIGS. 5A and 5B are fixed by stopper. The die pad 3 is sandwiched by a punch and a die to apply a tensile stress to the suspension pins 4. This tensile stress causes the tapered regions 6 with the notches 9 to show such respective deformations as opened, shown in FIGS. 5C and 5D. The presence of the open-type notch 9 or the deformations of the tapered region 6 with the open-type notch 9 allow the die pad 3 to show level down from the connection bars 8 by a depth even the suspension pins 4 show a slight stretch. Namely, the deformed open-type notch 9a has a larger width as shown in FIGS. 5C and 5D as compared to the original shape of the open-type notch 9 shown in FIGS. 5A and 5B. The combination of the above-described tapered shape end region 6 toward the end and the open-type notch 9 provides a desired flexibility without application of an excess mechanical tensile stress to the suspension pins 4, whereby the down-set of the die pad 3 can be realized without any possibility of the disconnection of the suspension pins 4.

Further, as shown in FIG. 5C, the deformation of the open-type notch 9 causes the tapered region 6 to have straight and not-tapered both-side edges which are important for the resin-molding process to be described below. The deformation of the tapered region 6 into the straight and not-tapered inside edges allows a highly accurate resin molding, and ensures that the connection bars 8 are free from the undesired resin molding, thereby making it easy to cut the suspension pins 4 to release the semiconductor package from the lead frame 7, wherein the semiconductor chip is mounted on the die pad 3 and resin-molded, while the bottom surface of the die pad 3 is shown from the molding resin.

As shown in FIG. 5D, the combination of the above-described tapered shape end region 6 toward the end and the open-type notch 9 also allows taking a large ratio of the down-set depth with reference to the horizontal size in the first horizontal direction of the suspension pin 4 in the down-set state. This means that the combination of the above-described tapered shape end region 6 toward the end and the open-type notch 9 allows taking a large ratio of the down-set depth with reference to the length size of the suspension pin 4.

Figure 6:
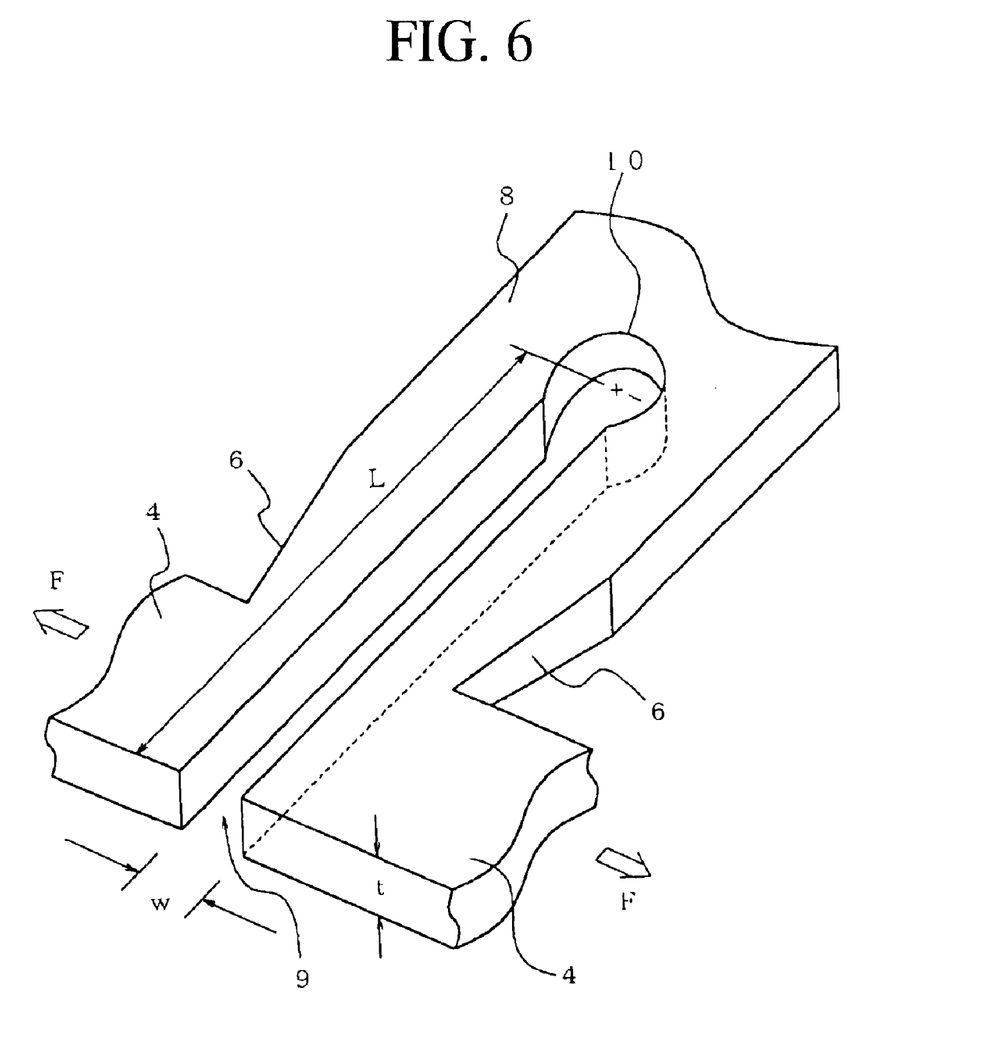
FIG. 6 is a fragmentary perspective view of a tapered end region with an open-type notch of each of connection bars of a lead frame of FIG. 5A.

The tapered shape end region 6 with the open-type notch 9 of the each connection bar 8 will be described in detail with reference to FIG. 6. The open-type notch 9 comprises a straight slender band region extending from the end of the each connection bar 8 along the longitudinal center axis and terminated or closed with a circle-shape termination region 10. The down-set process applies tensile stresses to the adjacent suspension pins 4 in the anti-parallel directions to each other but in parallel to the second horizontal direction as described above. This application of the tensile stress causes the open-type notch 9 to open widely, so that the tapered side edges 6 become straight and parallel to the second horizontal direction.

It is assumed that the thickness of the connection bar 8 is "t", a width of the straight slender band region of the open-type notch 9 represents "W", and a length of the open-type notch 9 represents "L". An typical preferred example of the size or dimension of the open-type notch 9 was confirmed by the present inventor as follows. The width "W" is preferably in the range of "t" to "2t", while the length "L" is preferably in the range of "5t" to "10t". Further, it was confirmed that the circle-shape termination region 10 provides a high flexibility to the opening degree of the open-type notch 9 in the down-set process. This high flexibility may avoid an undesired formation of a gap between a bottom surface of the die pad 3 and an inner wall of the bottom die, and ensures that the bottom surface of the die pad 3 is shown from the bottom of the semiconductor package.

Accordingly, the combination of the above-described tapered shape end region 6 and the open-type notch 9 allows taking a large ratio of the down-set depth to the horizontal size of the suspension pin 4, thereby making it possible to decrease or reduce the necessary minimum length size of the suspension pin 4. This makes it possible to increase the occupied area of the die pad 3 in the lead frame 7. This would give rise to increase the occupied area of the semiconductor chip as packaged, and thus increase the packaging density of the semiconductor device. The increase of the occupied area of the die pad 3 increases the die pad exposed surface area which defines the heat radiation area, to improve the efficiency of the heat radiation from the semiconductor chip through the die pad 3. The increase in the packaging density causes the size down or the shrinkage of the semiconductor package. This also makes it easy to reduce the manufacturing cost of the semiconductor package.

Figure 7A:
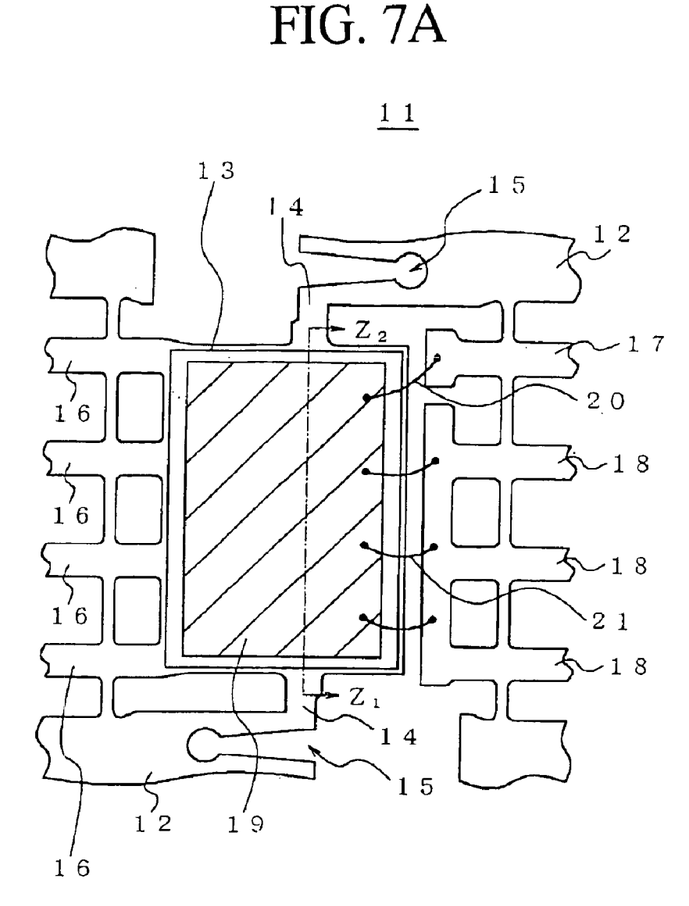
FIG. 7A is a schematic fragmentary plan view of a third typical structure after down-set of a lead frame in a third embodiment according to the present invention.
Figure 7B:
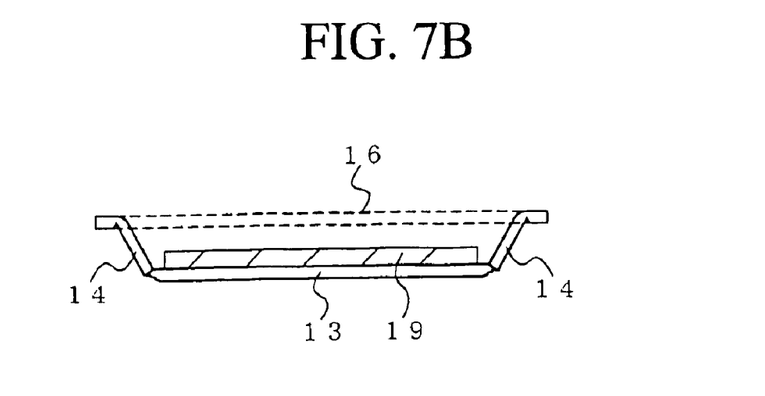
FIG. 7B is a cross sectional elevation view, taken along a Z1–Z2 line of FIG. 7A.

Third Embodiment:

A third embodiment according to the present invention will be described in detail with reference to the drawings. FIG. 7A is a schematic fragmentary plan view of a third typical structure after down-set of a lead frame in a third embodiment according to the present invention. FIG. 7B is a cross sectional elevation view, taken along a Z1–Z2 line of FIG. 7A.

A lead frame 11 has a plurality of die pads 13, which of which is mechanically connected through a pair of suspension pins 14 to tapered end regions of adjacent two of plural connection bars 12, so that the each die pad 13 is mechanically supported via the paired suspension pins 14 by the adjacent two of plural connection bars 12. The each connection bar 12 extends in a second horizontal direction perpendicular to a first horizontal direction, while the each suspension pin 14 extends from the tapered end region of the each connection bar 12 in the first horizontal direction to the die pad 13. Adjacent two of the connection bars 12 extend in anti-parallel directions to each other but parallel to the second horizontal direction.

The tapered end region 6 also has an open-type notch 15 which has a slender shape and extends from the end of the tapered end region in the second horizontal direction along a longitudinal center axis of the each connection bar 12. The open-type notch 15 has an open end and an opposite closed end. The open-type notch 15 divides the tapered end region into two divided tapered parts.

In accordance with this third typical embodiment of the present invention, the above-described open-type notch 15 and the tapered region are important for the down-set process to be described below. This lead frame 11 may be formed by press working and may be flat-shape, but thereafter the flat shaped lead frame is then subjected to the down-set process and the die pad 13 becomes level down as shown in FIG. 7B. The lead frame 11 may optionally and advantageously be made of a metal or an alloy, preferably copper alloys, or iron-nickel alloy. The down-set process may be carried out similarly to what has been described in the second embodiment. The tensile stress applied to the suspension pins 14 causes the tapered regions with the notches 15 to show such respective deformations as opened, shown in FIG. 7A. The presence of the open-type notch 15 or the deformations of the tapered region 6 with the open-type notch 15 allow the die pad 13 to show level down from the connection bars 12 by a depth even the suspension pins 14 show a slight stretch. Namely, the deformed open-type notch 15a has a larger width as shown in FIG. 7A. The combination of the above-described tapered shape end region and the open-type notch 15 provides a desired flexibility without application of an excess mechanical tensile stress to the suspension pins 14, whereby the down-set of the die pad 13 can be realized without any possibility of the disconnection of the suspension pins 14.

As shown in FIG. 7A, the combination of the above-described tapered shape end region and the open-type notch 15 also allows taking a large ratio of the down-set depth with reference to the horizontal size in the first horizontal direction of the suspension pin 14 in the down-set state. This means that the combination of the above-described tapered shape end region and the open-type notch 15 allows taking a large ratio of the down-set depth with reference to the length size of the suspension pin 14.

Similarly to the above-described second embodiment, the open-type notch 15 comprises a straight slender band region extending from the end of the each connection bar 12 along the longitudinal center axis and terminated or closed with a circle-shape termination region. The down-set process applies tensile stresses to the adjacent suspension pins 14 in the anti-parallel directions to each other but in parallel to the third horizontal direction as described above. This application of the tensile stress causes the open-type notch 15 to open widely, so that the tapered side edges become straight and parallel to the third horizontal direction. The circle-shape termination region provides a high flexibility to the opening degree of the open-type notch 15 in the down-set process. This high flexibility may avoid an undesired formation of a gap between a bottom surface of the die pad 13 and an inner wall of the bottom die, and ensures that the bottom surface of the die pad 13 is shown from the bottom of the semiconductor package.

Further, as shown in FIG. 7A, plural drain leads 16 are provided which are directly connected and united with the each die pad 13, wherein the drain leads 16 extend from a first side of the each die pad 13 and in parallel to the second horizontal direction. A gate lead 17 and plural source leads 18 are also provided which are indirectly connected via bonding wires 20 to a gate electrode pad and source electrode pads of a semiconductor chip 19 mounted on the each die pad 13, wherein the gate lead 17 and the plural source leads 18 extend from an opposite second side of the each die pad 13 and in parallel to the second horizontal direction.

Figure 8:
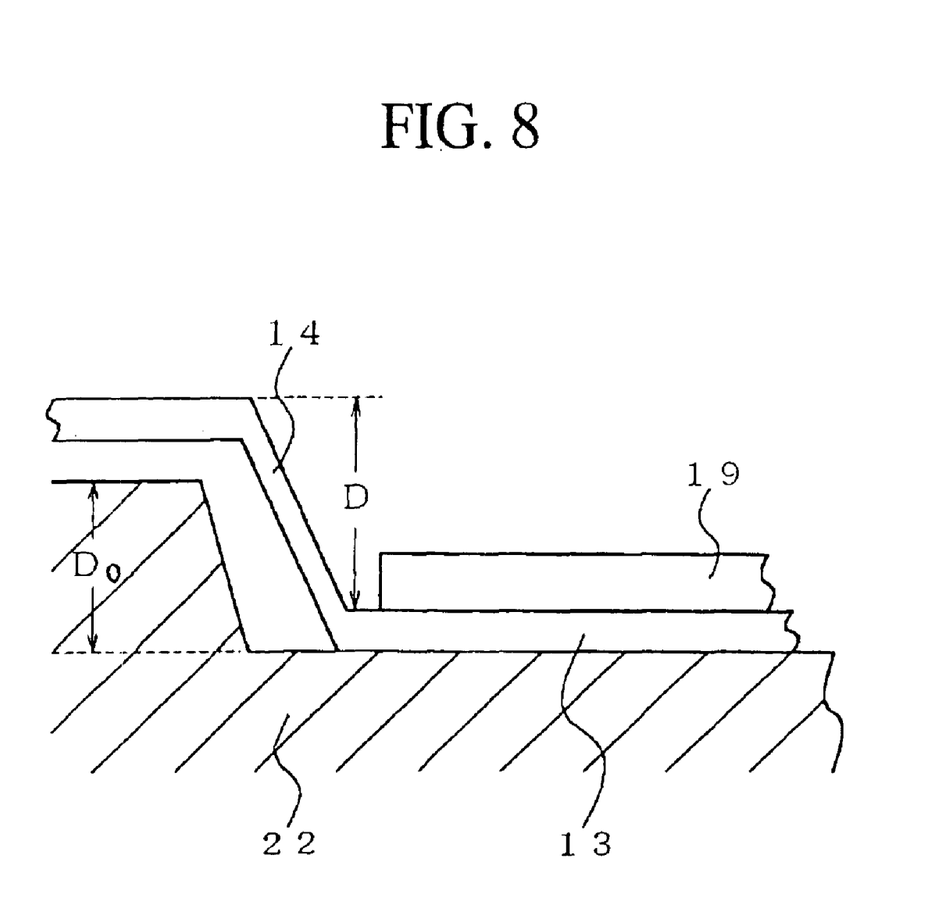
FIG. 8 is a fragmentary cross sectional elevation view of a down-set die pad mounted with a semiconductor chip and placed in a resin-molding die.

FIG. 8 is a fragmentary cross sectional elevation view of a down-set die pad mounted with a semiconductor chip and placed in a resin-molding die. The die pad 13 mounted with the semiconductor chip 19 is pressed to an inner bottom wall of a resin-molding die 22. The inner bottom wall has a step-like sectioned shape with a step level difference "D0". It should be noted that the step level difference "D0" of the inner bottom wall of a resin-molding die 22 is designed to be smaller than the intended down-set depth "D".

An injection of a molding resin into the molding dies is carried out with keeping the die pad 13 pressed to the inner bottom wall of the resin-molding die 22. Since the step level difference "D0" of the inner bottom wall of a resin-molding die 22 is smaller than the intended down-set depth "D", then no gap is formed between the bottom surface of the die pad 13 and the inner bottom wall of the resin-molding die 22. For example, the step level difference "D0" may be smaller by about several tens micrometers than the intended down-set depth "D".

Further, the above-described circle-shape termination region 10 provides a high flexibility to the opening degree of the open-type notch 15 in the down-set process. This high flexibility may avoid an undesired formation of a gap between a bottom surface of the die pad 13 and an inner wall of the bottom die, and ensures that the bottom surface of the die pad 13 is shown from the bottom of the semiconductor package.

Figure 9:
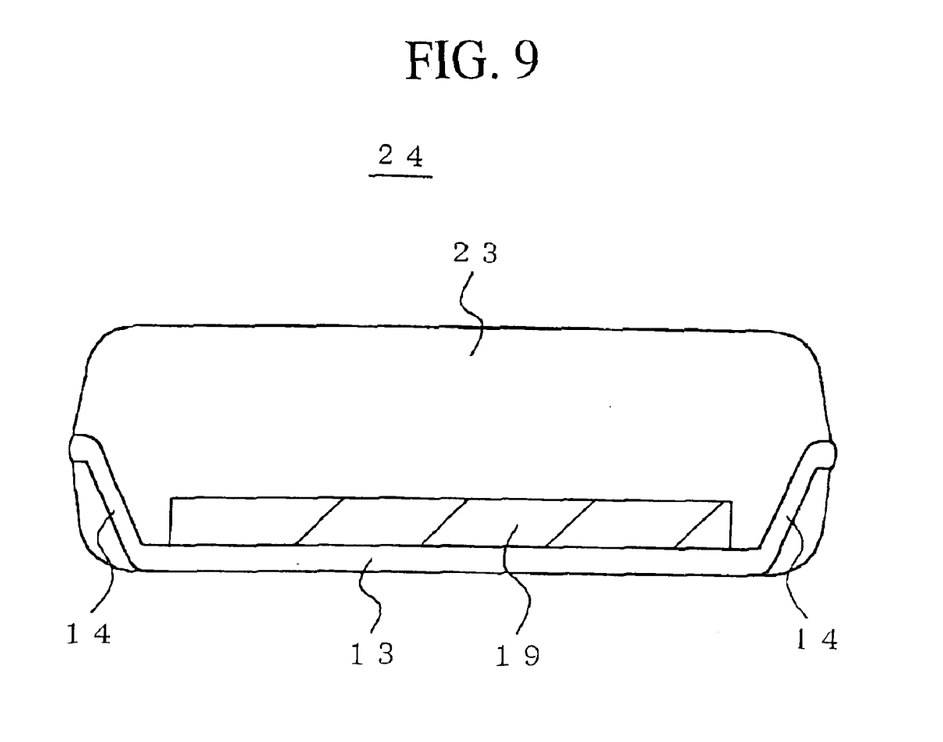
FIG. 9 is a cross sectional elevation view of a semiconductor package formed in accordance with the novel method of the present invention.

Further, as shown in FIG. 7A, the deformation of the open-type notch 15 causes the tapered region 6 to have straight and not-tapered both-side edges which are important for the resin-molding process to be described below. The deformation of the tapered region into the straight and not-tapered inside edges allows a highly accurate resin molding, and ensures that the connection bars 12 are free from the undesired resin molding, thereby making it easy to cut the suspension pins 14 to release a semiconductor package 24 from the lead frame 11, wherein the semiconductor chip 19 is mounted on the die pad 13 and resin-molded with a resin 23, while the bottom surface of the die pad 13 is shown from the molding resin 23 as shown in FIG. 9.

Accordingly, the combination of the above-described tapered shape end region and the open-type notch 15 allows taking a large ratio of the down-set depth to the horizontal size of the suspension pin 14, thereby making it possible to decrease or reduce the necessary minimum length size of the suspension pin 14. This makes it possible to increase the occupied area of the die pad 13 in the lead frame 11. This would give rise to increase the occupied area of the semiconductor chip as packaged, and thus increase the packaging density of the semiconductor device. The increase of the occupied area of the die pad 13 increases the die pad exposed surface area which defines the heat radiation area, to improve the efficiency of the heat radiation from the semiconductor chip through the die pad 13. The increase in the packaging density causes the size down or the shrinkage of the semiconductor package. This also makes it easy to reduce the manufacturing cost of the semiconductor package.

In accordance with this third embodiment, the suspension pins have been cut for no longer use as leads, but in order to release the semiconductor package 24 from the lead frame 11. It is, however, possible to apply the novel lead frame of the present invention to the other case, wherein the long suspension pins are provided without cutting the same for use of the leads from the semiconductor device.

The present invention is also applicable to a difference case that the semiconductor chip is mounted on the lead frame free from the down-set process for packaging the semiconductor chip with the same resin-molding die as shown in FIG. 8. This means that the present invention allows the common use of the same resin-molding die for the different types of the lead frames, for example, the down-set lead frame and the down-set-free lead frame. This improves the return on investment.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A lead frame structure including:
   at least one die pad for mounting a semiconductor chip thereon, comprising a plurality of edges;
   a plurality of suspension members each having a first end and a second end, wherein said first end is mechanically connected with an edge of said die pad;

a plurality of supporting members aligned parallel to each other, wherein said at least one die pad and said plurality of suspension members are positioned between two of said plurality of supporting members, and wherein said second end of said plurality of suspension members is mechanically connected to a connection region of a supporting member for mechanically supporting said at least one die pad, wherein:
said connection region of said supporting member has a penetrating opening portion which provides a mechanical flexibility to said connection region and which allows said connection region to be deformed toward said suspension member upon application of a tensile stress to said suspension member, said penetrating opening portion comprises a single slender-shaped continuously extending opening portion which extends along a longitudinal center axis of said supporting member, and perpendicular to a center line of said suspension member, and said connection region has at least an tapered side-edge which retracts from said suspension member as a position becomes closer to said suspension member, and said tapered side-edge has an acute angle to said center line of said suspension member.

2. The lead frame structure as claimed in claim 1, wherein said single slender-shaped continuously extending opening portion comprises a slit having opposite closed ends.

3. A lead frame structure as down-set including:
at least one die pad with a semiconductor chip mounted thereon, comprising a plurality of edges;
a plurality of suspension members each having a first and a second end, wherein said first end is mechanically connected with an edge of said at least one die pad;
a plurality of supporting members aligned parallel to each other, wherein said at least one die pad and said plurality of suspension members are positioned between two of said plurality of supporting members, and wherein said second end of said plurality of suspension members is mechanically connected to a connection region of a supporting member for mechanically supporting said at least one die pad, and wherein said plurality of supporting members has a higher level than said at least one die pad, wherein:
said connection region of said supporting member has a deformed penetrating opening portion toward said suspension member as applied with a tensile stress to said suspension member in a state of said lead frame structure as down-set, said deformed penetrating opening portion comprises a single slender-shaped continuously extending opening portion which extends along a longitudinal center axis of said supporting member, and perpendicular to a center line of said suspension member, and said connection region has at least a straight side-edge deformed from such a tapered side-edge as having retracted from said suspension member as a position becomes closer to said suspension member, and said tapered side-edge has an acute angle to said center line of said suspension member.

4. The lead frame structure as claimed in claim 3, wherein said single slender-shaped continuously extending opening portion comprises a slit having opposite closed ends.

* * * * *